US007126361B1

(12) United States Patent
Anderson et al.

(10) Patent No.: US 7,126,361 B1
(45) Date of Patent: Oct. 24, 2006

(54) VERTICAL PROBE CARD AND AIR COOLED PROBE HEAD SYSTEM

(75) Inventors: Michael L. Anderson, San Jose, CA (US); Edward A. McCloud, Castro Valley, CA (US); Shahriar Mostarshed, San Mateo, CA (US); Michael A. Casolo, Oakland, CA (US)

(73) Assignee: Qualitau, Inc., Santa Clara, CA (US)

( * ) Notice: Subject to any disclaimer, the term of this patent is extended or adjusted under 35 U.S.C. 154(b) by 0 days.

(21) Appl. No.: 11/195,990

(22) Filed: Aug. 3, 2005

(51) Int. Cl.
*G01R 31/02* (2006.01)

(52) U.S. Cl. ...................................... 324/754; 324/760

(58) Field of Classification Search ................ 324/754, 324/761, 762, 765, 760; 439/482
See application file for complete search history.

(56) References Cited

U.S. PATENT DOCUMENTS 4,038,599 A * 7/1977 Bove et al. ................. 324/754
4,195,259 A * 3/1980 Reid et al. .................. 324/754
6,342,788 B1 * 1/2002 McAllister et al. ......... 324/754
6,515,358 B1 * 2/2003 Dass et al. .................. 257/684

* cited by examiner

*Primary Examiner*—Minh Nhut Tang
*Assistant Examiner*—Arleen M. Vazquez
(74) *Attorney, Agent, or Firm*—Beyer Weaver & Thomas LLP

(57) ABSTRACT

A probe card is vertically mounted generally perpendicular to a wafer undergoing life tests in a heated environment to limit exposure of the probe card to heat from the wafer chuck. The probe card and probe head assembly are mounted on a support rail which has one or more channels for the flow of cool air to a probe head assembly and the probe card, while it shields the flex cable from the hot chuck. The cool air flow disrupts convective hot air flow upwards from the heated chuck to the probe card and probe head and facilitates cooling of the probe card and probe head.

23 Claims, 9 Drawing Sheets

32
36
34
40
10
30
38

VERTICAL PROBE CARD AND AIR COOLED PROBE HEAD SYSTEM

BACKGROUND OF THE INVENTION

This invention relates generally to the testing of semiconductor integrated circuits (ICs) and devices, and more particularly the invention relates to long term testing of such circuits and devices in a heated environment.

In the electrical probing and measuring of electrical parameters of integrated circuits and devices in semiconductor wafers, a probe card with multiple pins facilitates concurrent access to a large number of circuit contacts in one or more devices in the wafer. Typically one or more probe cards are horizontally arranged parallel to and spaced from the wafer so that "massively parallel" measurements can be made on a single wafer. Alternately, a single card with multiple pin probes and multiple landing patterns can be made, but the demands on materials, manufacturing, and planarity of the multiple landing sites makes it prohibitively expensive.

The long term testing of semiconductor devices, such as electro-migration, time dependent dielectric breakdown, and negative temperature bias instability, is undertaken to determine long term stability and lifetime of the device. To shorten the time required for such tests, the tests are often performed at elevated temperatures between 125° C.–400° C.

Major problems arise from heating of the probe card and probe head system. The horizontal probe card is the closest component to the hot chuck which holds the semiconductor wafer and can suffer a drastic degradation in performance due to temperature dependent leakage current. The large exposed area of the horizontal probe card exacerbates the degradation in probe performance. Material selection for the probe card can reduce the temperature dependent problems, but costs and special material processing considerations limit the practicality of using such materials as ceramics and liquid crystal polymers, for example, when compared to conventional materials used in printed circuit board manufacturing.

Another problem relates to heating of the cabling system necessary in connecting the multiple pins of the probe cards to test apparatus. To keep the cabling system within a manageable size, a custom flexible (flex) cable is typically employed. However, convective flow of hot air from the hot wafer chuck can cause unacceptable electrical leakage of current through the flex cable. The material used in these lower-cost flexible printed circuits, and in particular the adhesive used therein, has low (e.g. 40° C.–80° C.) glass transition temperature (Tg), and electrical leakage between traces will render the cable useless at temperatures higher than Tg. Other materials, such as liquid crystal polymers and high glass transition, thermally cured adhesives, have better high temperature performance but are much more expensive in a system with multiple probe heads and high density of signal traces.

Moreover, the probe card is typically part of a probe head which can be moved in XYZ alignment by manual control knobs. However, the control knobs associated with the probe head can become very hot to touch.

Therefore, a system with multiple probe heads, each have multiple pin probes, is desirable for long term, highly parallel testing of wafers at elevated temperatures. The present invention is directed to providing such a system which overcomes problems associated with conventional test probe heads and systems.

SUMMARY OF THE INVENTION

In accordance with the invention, probe cards are mounted generally vertically or perpendicular with respect to the surface of a wafer undergoing test. Such an arrangement limits exposure of a probe card to the heated environment of the hot chuck holding a device under test with the only significant transfer of heat to the card being by convective flow of air to the probe card edge closest to the heated surface and heat conductive flow through the probe tips touching the surface of a test wafer. However, neither channel of heat transfer prevents the use of conventional polyimide or other similar printed circuit board material and the use of conventional techniques for assembly of the probe card.

The probe card is part of a probe head which is vertically mounted on a rail support above a wafer undergoing test. The flex cable which interconnects the probe card to test apparatus is supported on the rail support. The rail support includes a forced air cooling system which delivers cool air in and around each probe head to disrupt convective flow of hot air from the hot check holding a test wafer upwards to the probe head and rail support. Cool air can be emitted from the cooling system through openings in the rail support such as holes or slits or slots whose size, shape and placement are a function of how much cooling capacity is needed and the temperature of the test wafer.

The invention and objects and features thereof will be more readily apparent from the following detailed description and appended claims when taken with the drawings.

DETAILED DESCRIPTION OF ILLUSTRATIVE EMBODIMENTS

Figure 1:
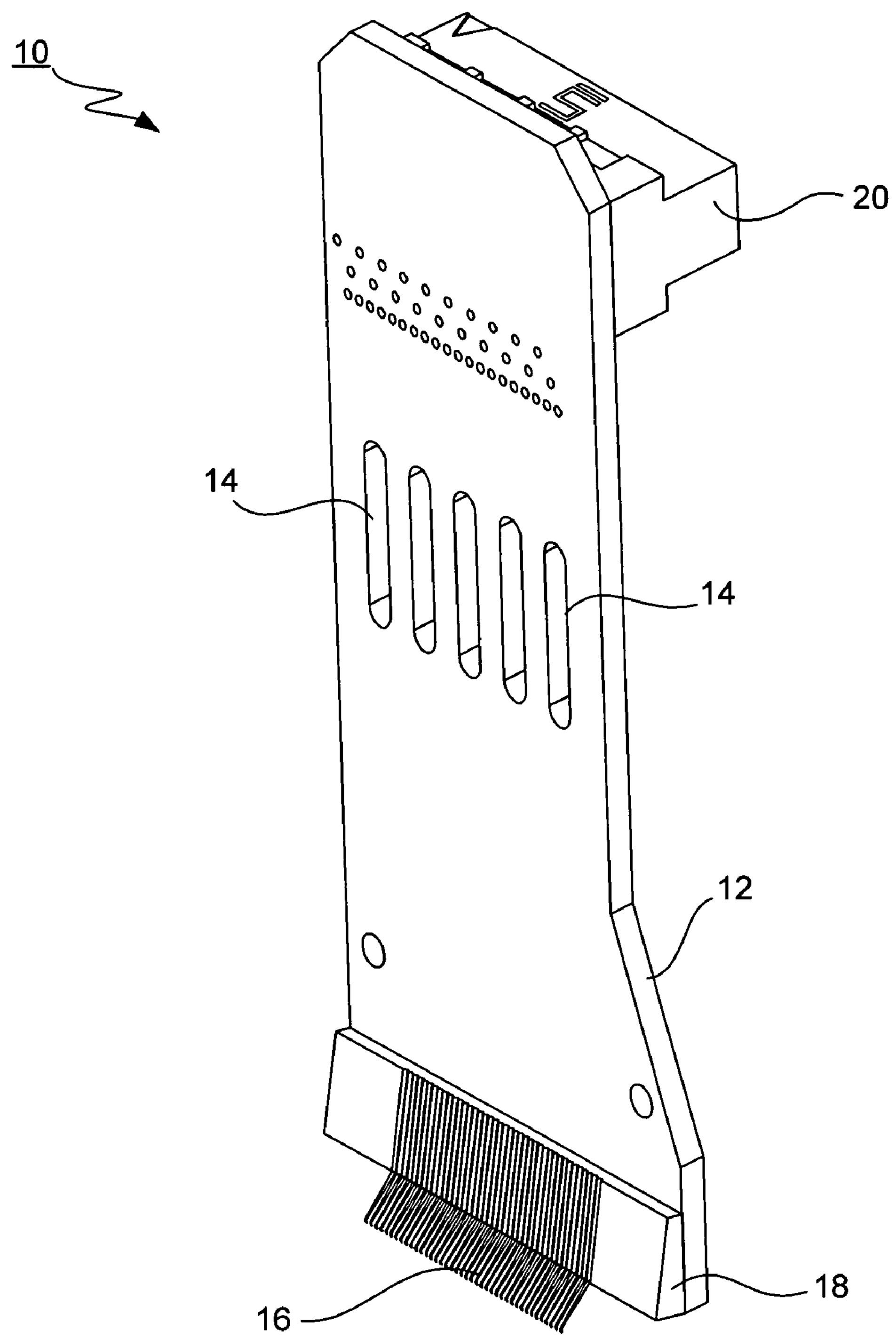
FIG. 1 is a perspective view of a probe card in accordance with an embodiment of the invention.

FIG. 1 is a perspective view of a probe card 10 in accordance with one embodiment of the invention and includes a printed circuit board 12 with a plurality of slots 14 therethrough for facilitating the flow of cool air. At one end of board 12 is a tip assembly including a plurality of metal probe tips 16 in a ceramic support 18 and on an opposing end of printed circuit board 12 is an electrical connector and fastener 20 which is used for physically supporting the probe card in a test system and connects the tips 16 to a flexible (flex) cable.

Figure 2:
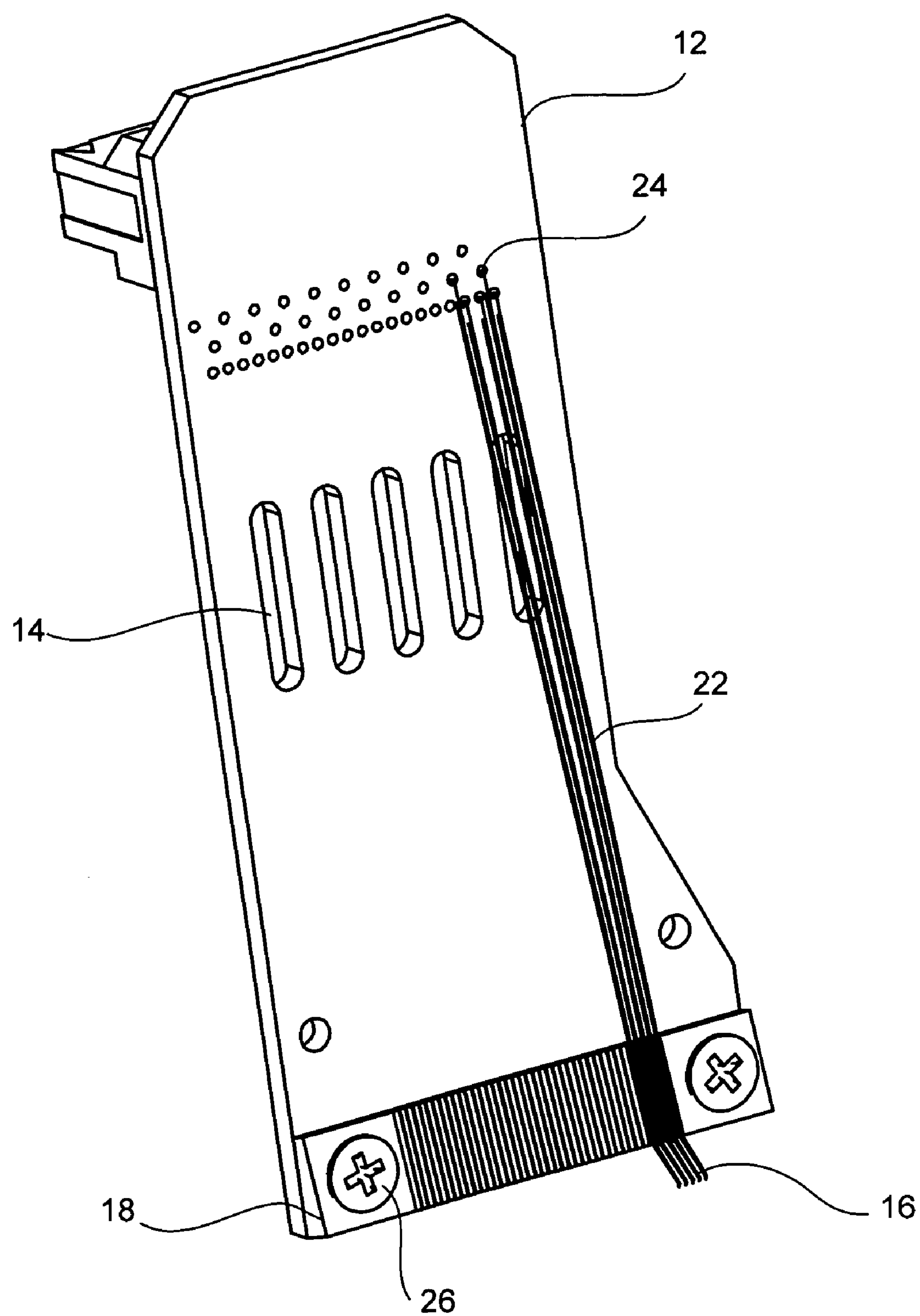
FIG. 2 is a plan view of the probe card of FIG. 1.

FIG. 2 is a plan view further illustrating printed circuit board 12 and metal traces 22 which electrically interconnect the probe tips 16 to electrical contacts 24 on the opposing end of board 12. The electrically conductive pattern of metal traces or discrete wires 22 interconnect individual probe tips to one of the contacts 24. As illustrated, ceramic support 18 with probe tips 16 supported therein is attached to board 12 by means of screw fasteners 26.

Figure 3:
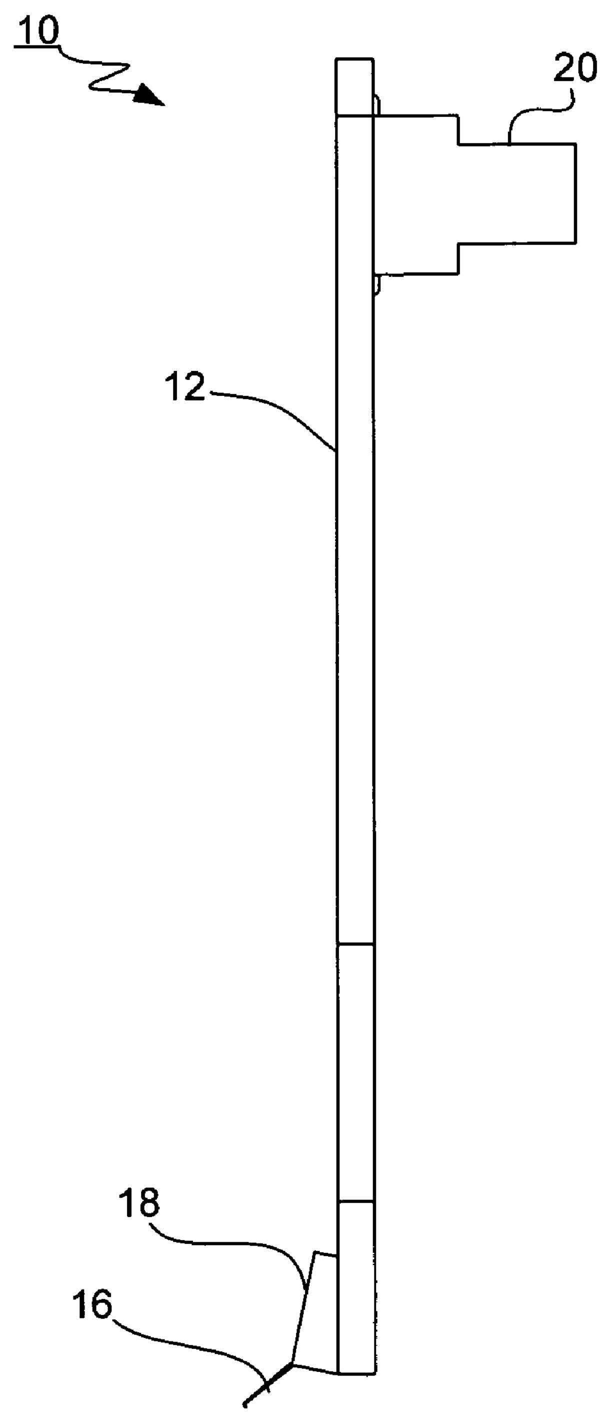
FIG. 3 is a side view of the probe card of FIG. 1.

FIG. 3 is a side view of the probe card illustrating electrical connector and fastener 20 which engages a receptacle in support apparatus to hold probe card 10 in a generally vertical or perpendicular position with respect to a wafer undergoing test. Only the ends of tips 16 engage the device undergoing test, thereby limiting heat conductive flow through the probe tips. The vertical alignment of probe card 10 limits the exposure of the card to heat emitted by the heated device chuck. Moreover, convective flow of air from the heated chuck to the probe card and supporting apparatus is disrupted by flow of cool air provided by the support assembly, as described below.

Figure 4:
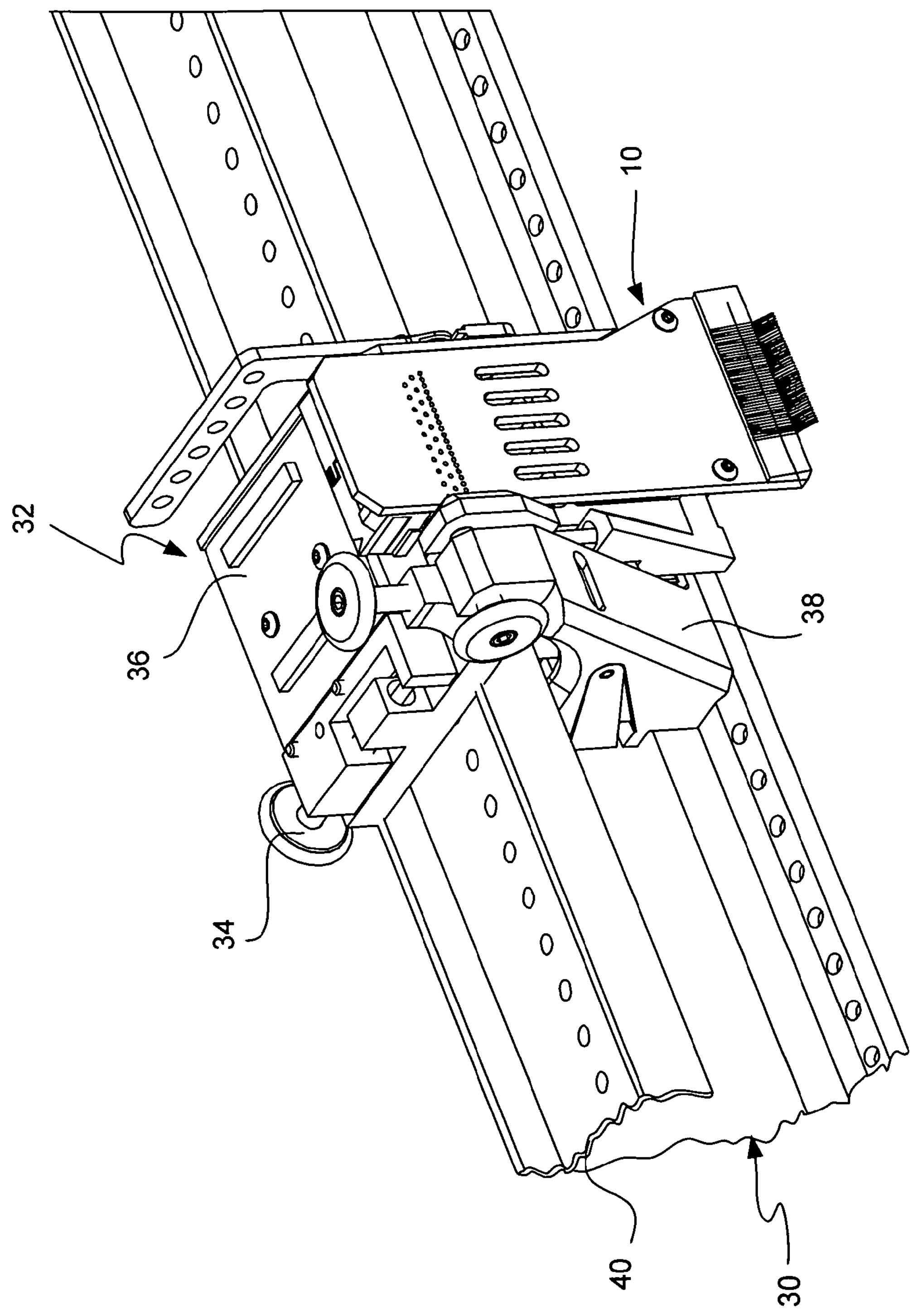
FIG. 4 is a perspective view of a rail and probe head assembly in accordance with an embodiment of the invention.

FIG. 4 is a perspective view of a support rail 30 which supports probe card 10 and a probe head shown generally at 32 above a device undergoing test and a heated support chuck. As is conventional, probe head 32 can be adjusted manually along three axes of movement by means of control knobs 34, 36, 38. A flex cable 40 is supported on the top of rail 30 and interconnects probe card 10 to external test apparatus. As noted above, flex cable 40 can degrade in performance if overheated.

Figure 5:
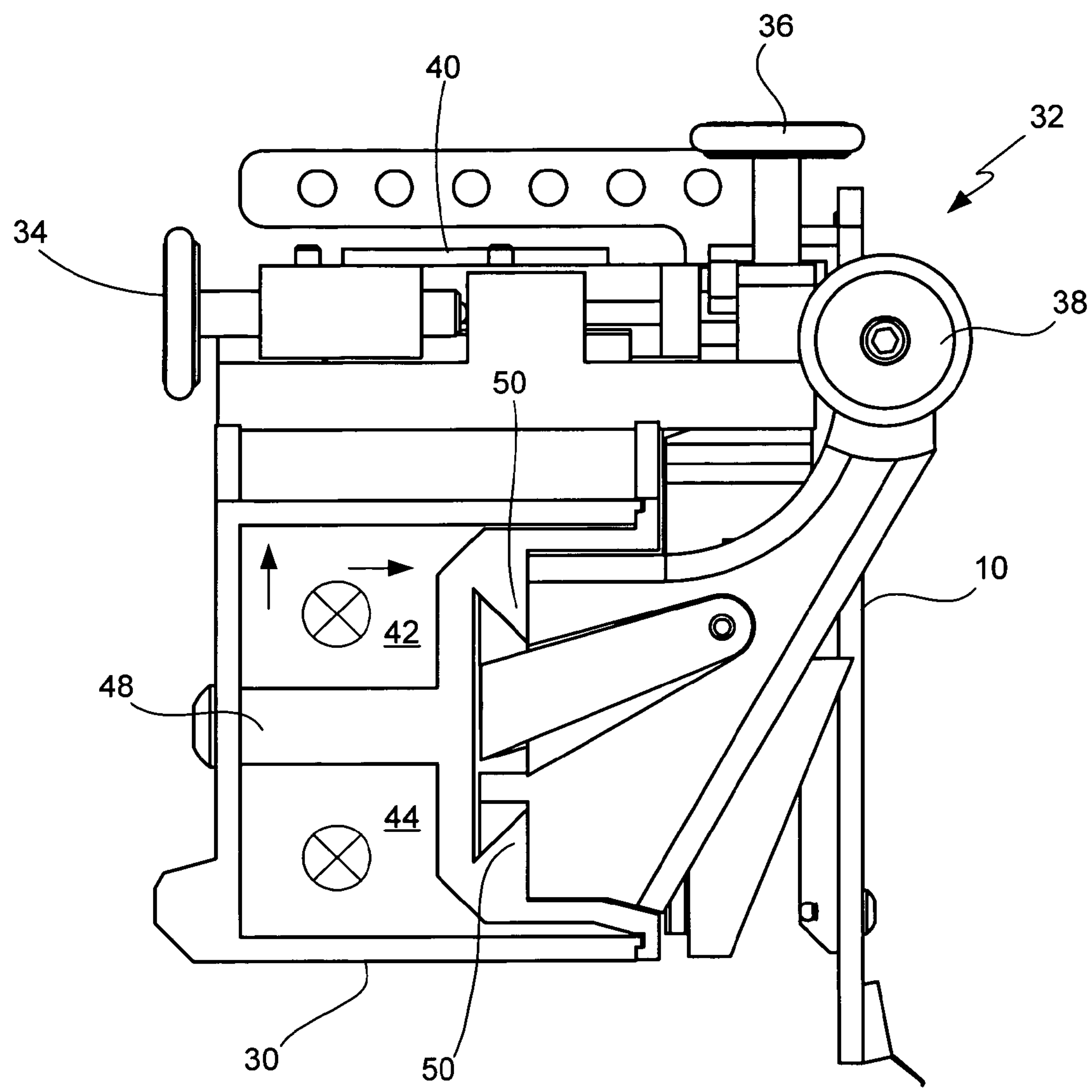
FIG. 5 is a side view in section of the rail and probe head assembly of FIG. 4.

FIG. 5 is a section view of rail 30 which includes internal channels 42, 44 for the flow of air used for cooling probe head 32, probe card 10, and flex cable 40. Air from the internal channels is emitted through openings in rail 30 with the air being directed through probe head 32 and probe card 10 for disrupting convective hot air flow from the heated chuck which holds the device under test. Accordingly, overheating of flex cable 40 and the printed circuit board of test probe 10 can be avoided. In this embodiment is will be noted that channel 30 includes a member 48 having dovetail flanges which engage mating dovetail flanges of probe head 32 as shown generally at 50.

Figure 6:
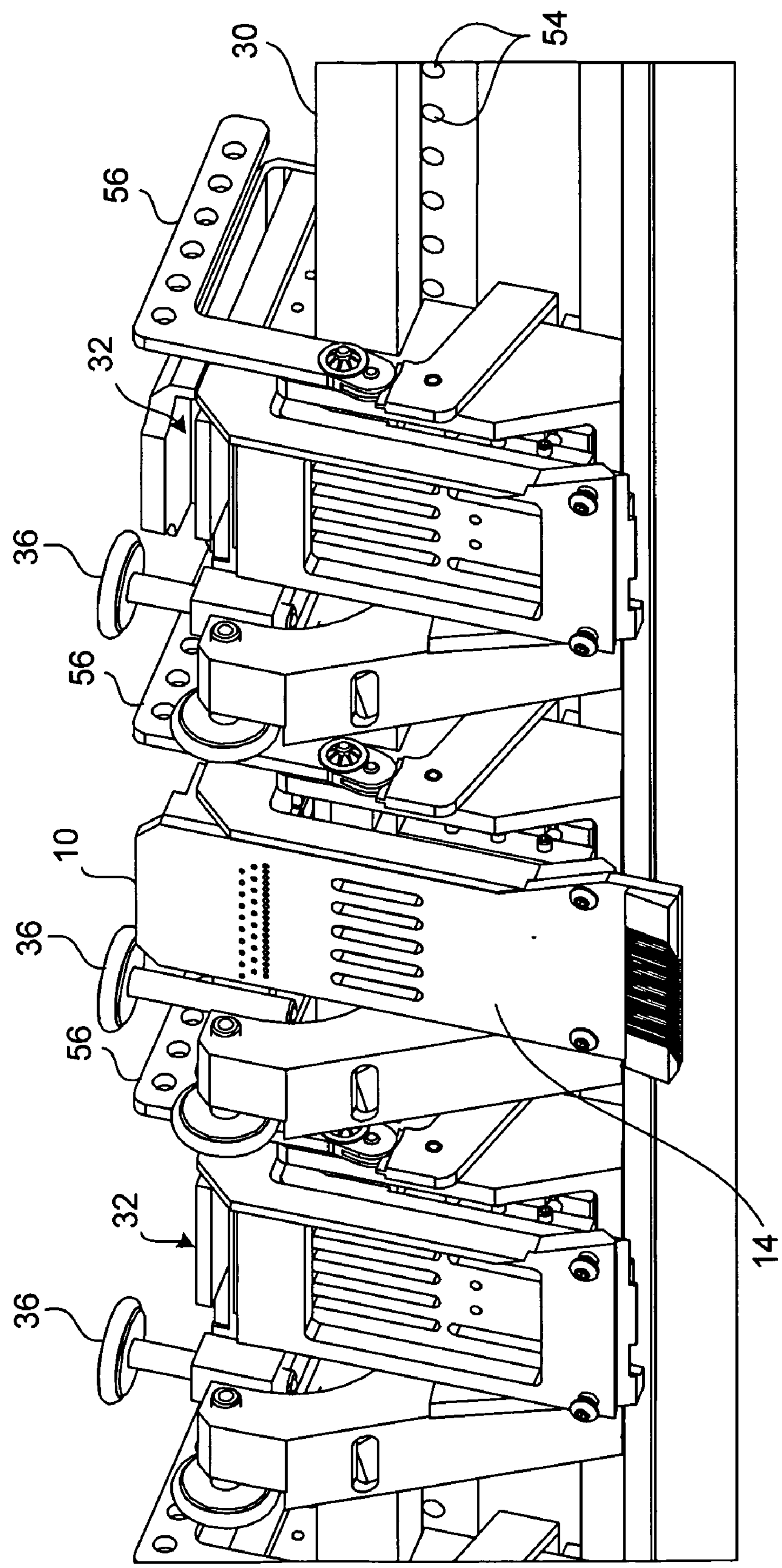
FIG. 6 is a perspective view of the rail with a plurality of probe heads mounted thereon and further illustrating the cooling system.

FIG. 6 is another perspective view of the rail 30 supporting three probe heads 32. In this embodiment, only one probe card 10 is shown on the probe heads to further illustrate openings or slots for facilitating the flow of cool air from openings 54 in frame 30 through the probe heads 32 and through the openings 14 in probe card 10. It will be noted in this embodiment that each probe head 32 has a lever mechanism shown generally at 56 which can be used for locking a probe head in the dovetailed flanges 50 of rail 30. However, the locking mechanism is not part of the invention and is not described further herein.

Figure 7:
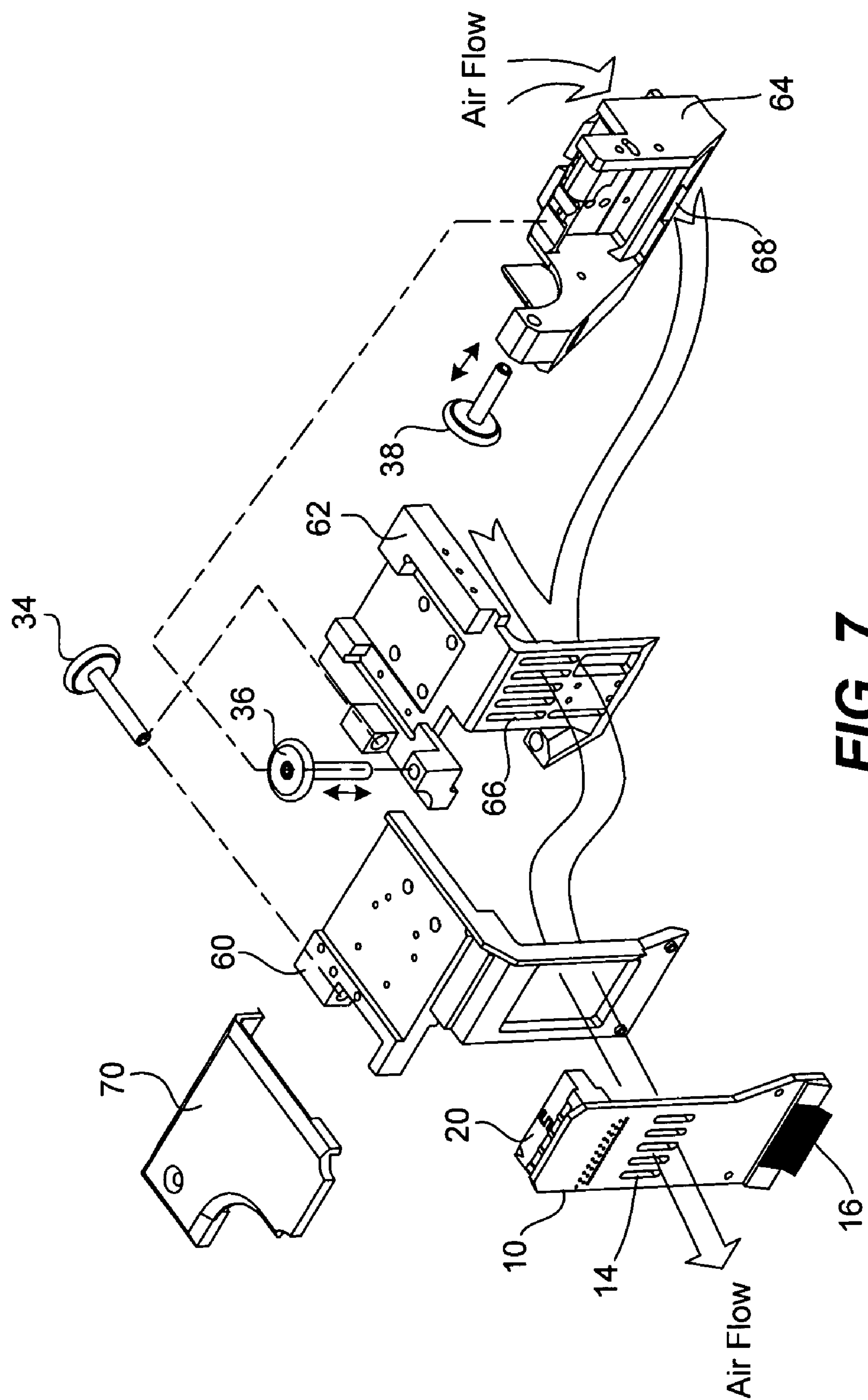
FIG. 7 is an exploded perspective view of components of a probe head in accordance with one embodiments of the invention and further illustrates airflow.

FIG. 7 is an exploded perspective view of components of the probe head and illustrating the flow of air through the probe head and probe card. In this embodiment the probe head includes three support frames 60, 62, 64 with the first support frame 60 receiving the probe card 10 by means of fastener 20, the second support frame 62 supporting frame 60 and allowing movement of support frame 60 along a first axis of movement by means of control knob 34, and the third support frame 64 supporting frame 62 and allowing movement of frame 62 and along second and third axes of movement by means of control knobs 36 and 38. Other spring biased fasteners which attach to the support frames are not illustrated in this view to facilitate illustration of the airflow which does constitute part of the invention. As noted, air emitted by openings 54 in rail 30 (FIG. 6) flows directly through slots 66 in support frame 62 and through a lower slot 68 in support frame 64 and then through an opening in support frame 60 to the slots 14 in probe card 10. Cover 70 is fastened to the top surface of support frame 60 to protect a horizontal transfer PC board 72 (FIG. 9) which has the receptacle for receiving fastener 20 of probe card 10.

Figure 8:
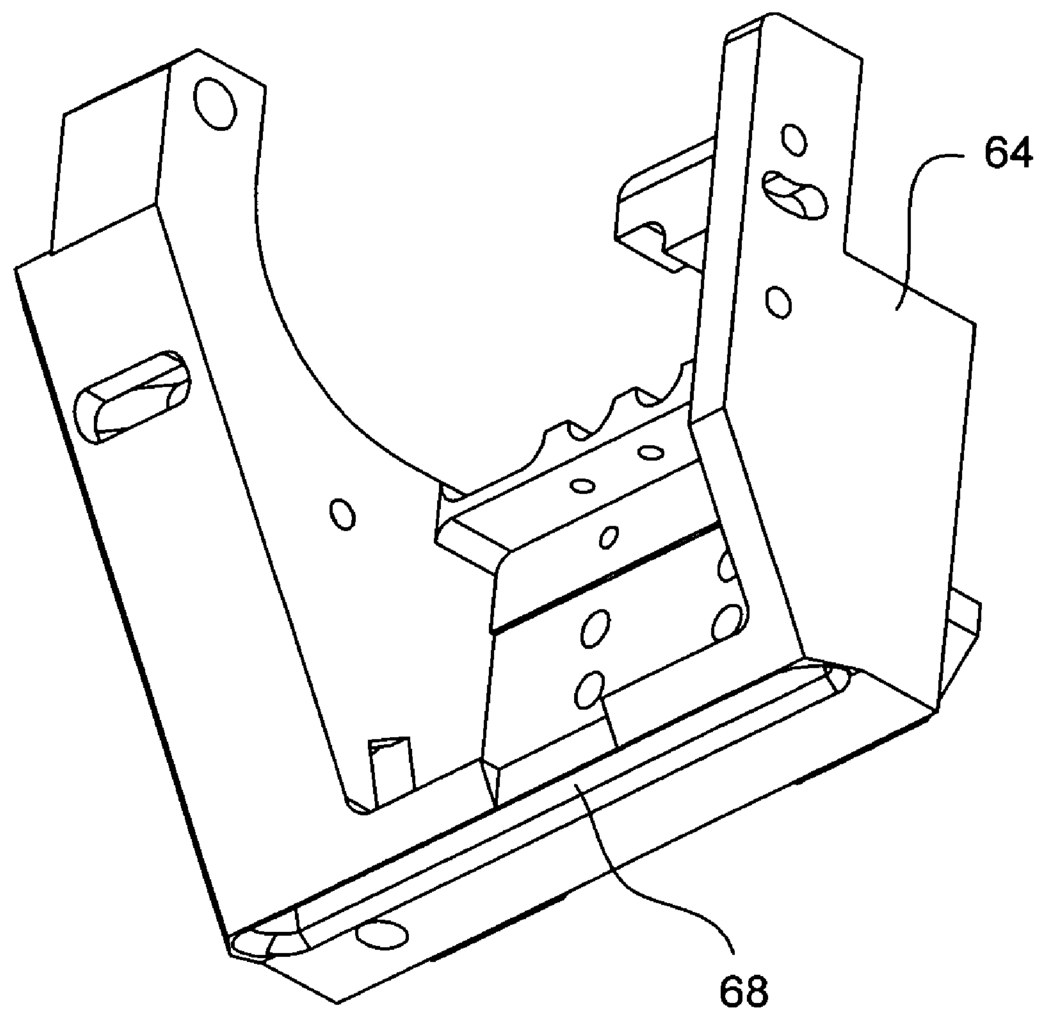
FIG. 8 is an enlarged perspective view of a support frame in the probe head of FIG. 7.

FIG. 8 is an enlarged perspective view of a portion of support frame 64 further illustrating the placement of slot 68 which facilitates airflow from the support rail through the slot and up through the probe head assembly. Holes or other openings can be provided in the bottom of rail 30 to facilitate this flow of air. These additional holes from the side lobes of the lower section of the rail may be at an angle ($\theta>0$) as illustrated in FIG. 5 with respect to the surface of a test wafer. The angle may be determined by the temperature of the surface, flow rate of cool air coming out of the holes and the constraints set on temperature uniformity of the wafer surface. Since the cool air coming out of the holes may cause temperature disturbance of the surface, depending on flow and the angle at which it flows, these parameters will be customized adjustments to the system depending on the maximum wafer temperature required by a test. The purpose of this airflow outlet is also to aid in keeping the vertically convective flow of hot air, coming from the wafer surface, away from the manual controls of the probe heads. Again, these holes can be replaced by slots in transverse or longitudinal directions, or a combination of slots and holes, or may be absent all together if not needed. If the holes are present, then the cool air flowing out of the side outlets is pushed up by the air from the outlets on the side lobes at the bottom of the rail, everywhere except for areas of the rail where the probe head is situated. To avoid air circulation and reflection back onto the surface of a wafer, which can cause the local temperature of the wafer to change considerably, there are vertical slits built into the head assembly in the direction normal to the surface which allows the air in the horizontal direct to escape. Again, the implementation of the airflow may not be limited to slits, and can constitute holes, arrays of holes or slits, or a combination of both. In addition, channels or ribbed sections can be built into the head to take the air coming out of the lobes at the bottom of the rails up and out over the rail.

Figure 9:
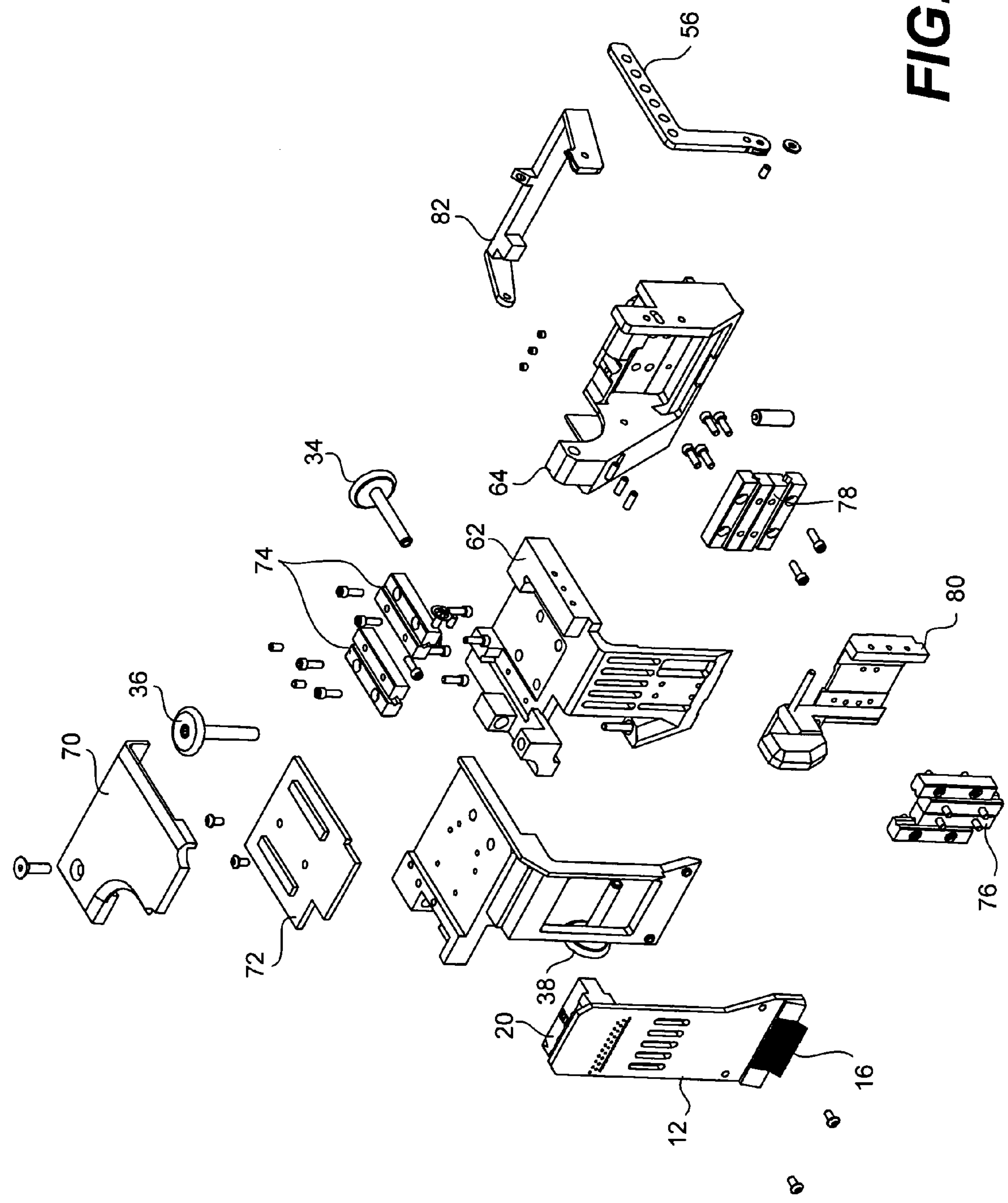
FIG. 9 is a more detailed exploded perspective view of components of the probe head of FIG. 7 showing the assembly thereof.

FIG. 9 is a more detailed exploded perspective view of components of the probe head of FIG. 7 showing the assembly thereof. Like elements in FIGS. 7 and 9 have the same reference numerals. Here a horizontal transfer printed circuit board 72 engages electrical connector and fastener 20 for providing connection between printed circuit board 12 and flex cable 40 (FIG. 4). A plurality of cross roller bearings 74 are fastened to ZY traveler frame 62 for movement of Y traveler frame 60 thereon. Likewise, cross roller bearings 76 and 78 provide for movement of XZ traveler frame 80 on X clamping bar frame 64. Cam lever 56 and cam follower bridge 82 are fastened to frame 64 and provide a locking function on rail support 30 (FIG. 6).

The arrangement of a probe card and probe head aligned generally perpendicular to and above a heated chuck for a device under test, coupled with the use of a flow of cool air to disrupt convective hot air flow, limits the area of exposure to the card to high temperatures and alleviates the heating of the probe card and flex cable due to convective hot air flow from the heated chuck.

While the invention has been described with reference to specific embodiments, the description is illustrative of the invention and is not to be construed as limiting the invention. Various applications may occur to those skilled in the art without departing from the spirit and scope of the invention as defined by the appended claims.

What is claimed is:

1. A generally planar probe card for mounting generally perpendicular to a heated planar device undergoing test to reduce heat transfer to the probe card during test, said probe card comprising:

a) a printed circuit board, b) a tip assembly including a plurality of probe tips on one end of the board for engaging a device undergoing test, c) a plurality of electrical contacts on an opposing end of the board, d) electrical conductors on the board for electrically connecting tips on the one end of the board to electrical contacts on the opposing end of the board, and e) a fastener for engaging a support above a device undergoing test with the printed circuit board in generally perpendicular alignment with the device undergoing test, whereby heat transfer from the heated device under test to the printed circuit board is reduced during test.

2. The probe card of claim 1 wherein the device undergoing test is a semiconductor wafer.

3. The probe card of claim 1 wherein the tip assembly includes a ceramic support for the plurality of tips.

4. The probe card of claim 3 and further including f) a plurality of openings through the board to facilitate the flow of air.

5. The probe card of claim 4 wherein the fastener comprises a projecting connector which mates with a receptacle in a support.

6. The probe card of claim 1 wherein the fastener comprises a projecting connector which mates with a receptacle in a support.

7. A probe head for mounting above a device undergoing test comprising:

a) a printed circuit board, b) a tip assembly including a plurality of probe tips on one end of the board for engaging a device undergoing test, c) a plurality of electrical contacts on an opposing end of the board, d) an electrically conductive pattern on the board for electrically connecting tips on the one end of the board to electrical contacts on the opposing end of the board, and e) a first fastener for engaging a mounting assembly above a device undergoing test with the printed circuit board in generally perpendicular alignment with the device undergoing test, and f) a mounting assembly on which the printed circuit board is supported and including a second fastener for engaging the first fastener.

8. The probe head of claim 7 wherein the mounting assembly includes means for supportably engaging a rail support structure.

9. The probe head of claim 8 wherein the mounting assembly and the printed circuit board include openings to facilitate the flow of cool air from the rail support structure.

10. The probe head of claim 9 wherein the mounting assembly includes means for manually adjusting the positioning of the printed circuit board on the mounting assembly.

11. The probe head of claim 10 wherein the mounting assembly includes a first support frame for receiving the printed circuit board, a second support frame for the first support frame and which allows movement of the first support frame along one axis, and a third support frame for the second support frame which allows movement of the second support frame along second and third axes of movement, and manually operated knobs for facilitating movements along the three axes.

12. The probe head of claim 11 wherein support frames include openings for the flow of air.

13. A forced air cooled probe head assembly for mounting a probe card generally above and perpendicular to a device undergoing electrical tests in a heated environment comprising:

a) a probe head including a printed circuit board, a tip assembly on one end of the printed circuit board, a plurality of contacts on an opposing end of the printed circuit board, and an electrically conductive pattern interconnecting the tip assembly and the plurality of contacts, and b) a rail assembly for supporting the probe head, the rail assembly including at least one channel for the flow of air and openings for directing the air towards the probe head whereby convective flow of hot air can be disrupted and cooled.

14. The forced air cooled probe head assembly of claim 13 and further including flexible cable supported by the rail assembly and coupled to the plurality of contacts.

15. The forced air cooled probe head assembly of claim 14 wherein the probe head further includes manually operated knobs for adjusting the position of the printed circuit board, the knobs being cooled by the flow of air.

16. The forced air cooled probe head assembly of claim 15 wherein the probe head further includes a first support frame for receiving the printed circuit board, a second support frame for the first support frame and which allows movement of the first support frame along one axis, and a third support frame for the second support frame which allows movement of the second support frame along second and third axes of movement, and manually operated knobs for facilitating movements along the three axes.

17. The forced air cooled probe head assembly as defined by claim 16 wherein the support frames include openings for the flow of air.

18. The forced air cooled probe head assembly of claim 17 wherein openings in the rail assembly direct air to the support frames and openings therein to facilitate the flow of air.

19. The forced air cooled probe head assembly of claim 17 wherein openings in the rail assembly include openings in lower portions of the rail assembly at an angle with respect to the surface of the test station to aid in disrupting vertical convective flow of hot air from the work station.

20. The forced air cooled probe head assembly of claim 19 wherein the openings in the rail assembly includes holes.

21. The forced air cooled probe head assembly of claim 19 wherein the openings in the rail assembly includes slots.

22. The forced air cooled probe head assembly of claim 17 wherein the openings in the support frame includes slots.

23. The forced air cooled probe head assembly of claim 17 wherein the printed circuit board includes openings for the flow of air.

* * * * *